US006437574B1

(12) United States Patent
Robinson et al.

(10) Patent No.: US 6,437,574 B1
(45) Date of Patent: Aug. 20, 2002

(54) AUXILIARY BATTERY TEST AND ALARM SYSTEM FOR TELECOMMUNICATION EQUIPMENT

(75) Inventors: Steven M. Robinson; Ralph R. Boudreaux, Jr., both of Madison; Daniel M. Joffe, Owens Crossroads, all of AL (US); John S. McGary, Petersburg, TN (US); James M. Glass, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 09/696,043

(22) Filed: Oct. 25, 2000

Related U.S. Application Data

(60) Provisional application No. 60/161,423, filed on Oct. 26, 1999.

(51) Int. Cl.[7] ............................................. G01N 27/416

(52) U.S. Cl. ........................................................ 324/426

(58) Field of Search ..................... 324/426; 307/37–97; 364/494, 495, 184

(56) References Cited

U.S. PATENT DOCUMENTS

| 4,673,826 A | * | 6/1987 | Masson .................... 307/37 |
| 5,576,941 A | * | 11/1996 | Nguyen et al. ............. 363/21 |
| 5,712,795 A | * | 1/1998 | Layman et al. ............ 700/297 |
| 5,734,204 A | * | 3/1998 | Sobue ....................... 307/64 |
| 6,274,949 B1 | * | 8/2001 | Lioux et al. ................ 307/64 |
| 6,274,950 B1 | * | 8/2001 | Gottlieb et al. ............. 307/66 |
| 6,275,946 B1 | * | 8/2001 | Meir ........................ 713/300 |

* cited by examiner

Primary Examiner—Edward H. Tso
Assistant Examiner—Pia Tibbitts
(74) Attorney, Agent, or Firm—Allen, Dyer, Doppelt, Milbrath & Gilchrist, P.A.

(57) ABSTRACT

An automated battery test system determines the performance capability of an auxiliary battery used as a back-up power source for an electrically powered system in the event of a deficiency in a primary power source. The test system periodically isolates the auxiliary battery from the primary power source and tests at least one electrical characteristic of the auxiliary battery, without preventing the auxiliary battery from being immediately reconnected with the primary power source in the event of a need for a back-up. A multiple alarm arrangement generates audible and visual alarms in response to a detected failure of the auxiliary battery.

16 Claims, 5 Drawing Sheets

AUXILIARY BATTERY TEST AND ALARM SYSTEM FOR TELECOMMUNICATION EQUIPMENT

CROSS-REFERENCE TO RELATED APPLICATION

The present application claims the benefit of previously filed co-pending U.S. Provisional Patent Application Serial No. 60/161,423, filed Oct. 26, 1999, entitled "Automatic Battery Test and Alarm System for Telecommunication Equipment," by S. Robinson et al, assigned to the assignee of the present application and the disclosure of which is incorporated herein.

FIELD OF THE INVENTION

The present invention relates in general to communication systems and components therefor, and is particularly directed to an automated, processor-controlled mechanism for periodically testing the 'health' of a back-up or auxiliary battery, that is used to supply power to an electrically powered system, such as that employing telecommunication equipment, in the event of a failure of the equipment's primary power source, and for generating at least one alarm indication if testing of the battery determines that the back-up battery has failed.

BACKGROUND OF THE INVENTION

Various system equipment providers, such as, but not limited to industrial, medical, communication and military equipment suppliers, often employ battery back-up for their deployed systems, in order to reduce the risk of loss of service to users/customers in the event of a failure of the equipment's principal power source. Typically, the operation of a system provider's equipment and primary power source are such that a back-up battery 10 (or batteries) remains charged and in a 'floating' state for long periods of time, as the need for battery back-up is hopefully a relatively infrequent occurrence. As a result of some battery failure mechanisms and the long periods between uses, the failure of a back-up battery may not be detected until its use is actually required. This may lead to the failure of equipment through which the customer/user is expecting uninterrupted service.

SUMMARY OF THE INVENTION

In accordance with the present invention, this undetected battery failure problem is remedied by employing a cost-efficient, processor-controlled mechanism that is operative to periodically test the back-up battery, without compromising the availability of the back-up battery for its intended purpose, and to provide an alarm indication should the back-up battery be determined to be in a failed condition. As will be described, the battery test mechanism of the invention employs an interconnected arrangement of voltage and current monitoring circuits, an isolating relay, an internal fixed current test load, and a microcontroller, to implement a battery diagnostic algorithm for testing the battery at regular intervals. If a battery failure is detected, audible, visible, and electronic alarms are activated.

The test sequence executed by the invention tests the backup battery by isolating the battery from its input voltage source, and then applies a prescribed load across the battery for a given time interval, in order to draw a fixed current from the battery. A voltage associated with this current drain is monitored for the presence of an excessive battery voltage drop. If an excessive voltage drop is detected, it is inferred that the battery has failed.

Because a discharged battery (such as a lead acid battery) may have similar characteristics to an old or failed battery, battery charging current is monitored to ensure that the battery is charged, and thereby properly distinguish between a good battery that has simply been discharged and an expired battery that needs to be replaced. When the battery performance test is commanded and battery charging current is detected, a timer is set to bound the maximum time allowed for charging the battery. At the end of the this maximum time interval, should the level of battery charging current still be above the designated threshold, a failed battery is indicated. However, if, prior to expiration of the maximum charge time, the charging current falls below the charge current threshold value, it is inferred that charging of the battery is effectively complete, and a battery performance test may be conducted. The battery is then isolated from the primary voltage source and a battery load test is performed.

At the outset of the battery performance test sequence, if discharge current is detected, it is inferred that the power system with which the battery is used has been placed in battery backup mode; testing of the battery (via the isolation and load sequence described above) is immediately deferred pending battery test availability (that is, when the battery is no longer discharging as a back-up power source and has completed recharging). During its performance test, once it has been isolated from the input source, the back-up battery is no longer available to back up the primary power source. To accommodate the potential need for immediate battery back-up, the primary input voltage is monitored during the battery performance test; if the primary source's voltage falls out of range, the back-up battery test is terminated and the battery is reconnected to the source. This operation occurs fast enough to prevent an interruption of power to the equipment.

DETAILED DESCRIPTION

Figure 1:
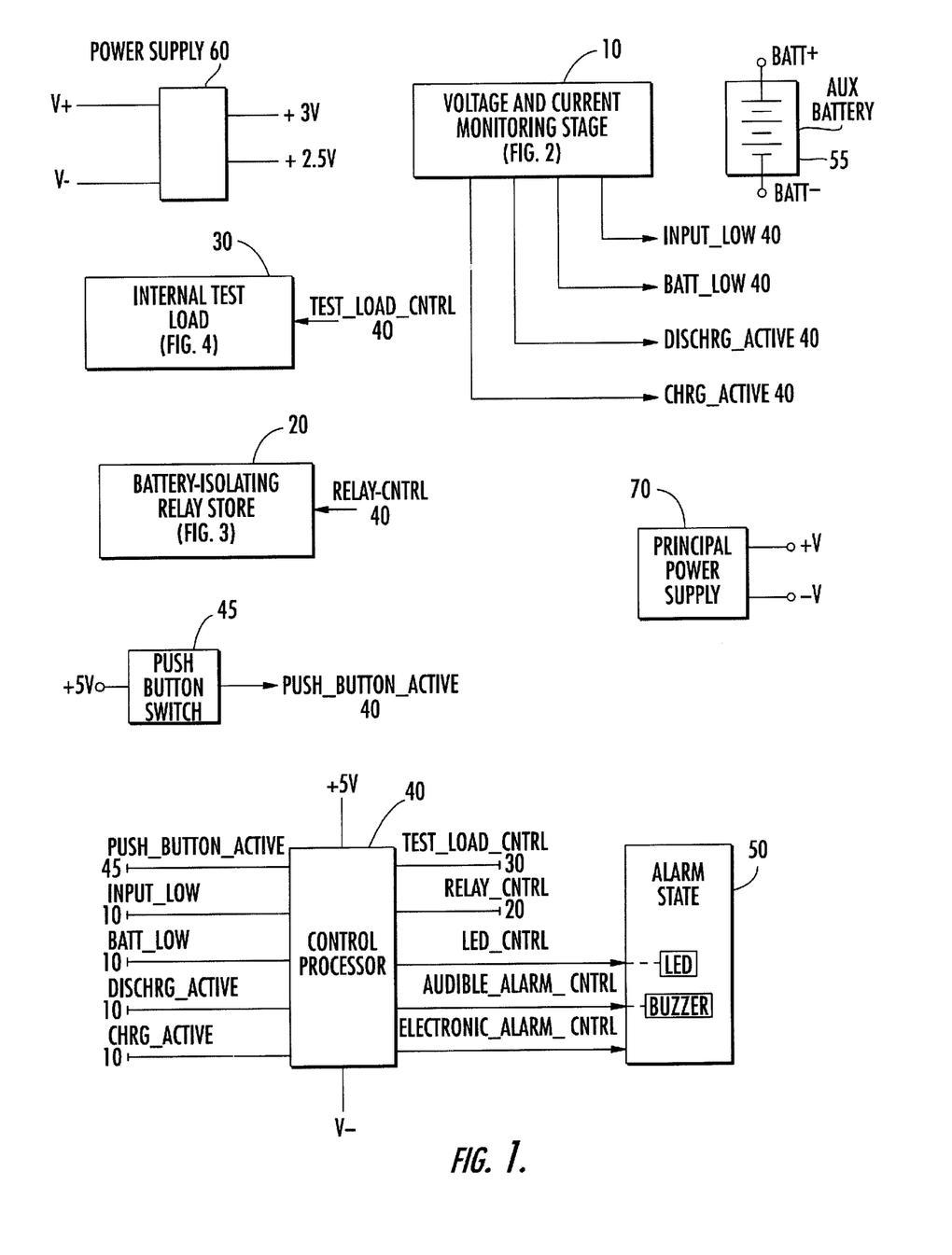
FIG. 1 diagrammatically illustrates a processor-controlled battery test system in accordance with the present invention.

As pointed out briefly above, and as shown diagrammatically in FIG. 1, the processor-controlled back-up battery test scheme of the present invention comprises an interconnected arrangement of a voltage and current monitoring stage 10, a battery-isolating relay stage 20, an internal fixed current test load 30, a supervisory control processor (microcontroller) 40, and an alarm stage 50. In addition, a power supply 60 coupled to (V+ and V−) terminals of a principal power source produces +5V supply voltage and +2.5V reference voltage. For purposes of providing a non-limiting example of an installation in which the present invention may be deployed, the following description will relate to its use in a telecommunication environment, such as a remote terminal of a incumbent local exchange carrier (ILEC), such as a Bell operating company (RBOC).

The test mechanism's control processor 40 is programmed to execute a prescribed battery diagnostic program that supplies control signals to and monitors outputs from the stages 10 and 20, and the test load 30, so as to periodically test a back-up battery 55, which is employed as an auxiliary or back-up power source for powering one or more pieces of powered equipment (such as, but not limited to telecommunication equipment) in the event of an anomaly in the equipment's primary power source. In addition, the control processor 40 also receives user input from a push button switch 45 that is active when the push button is depressed.

Figure 2:
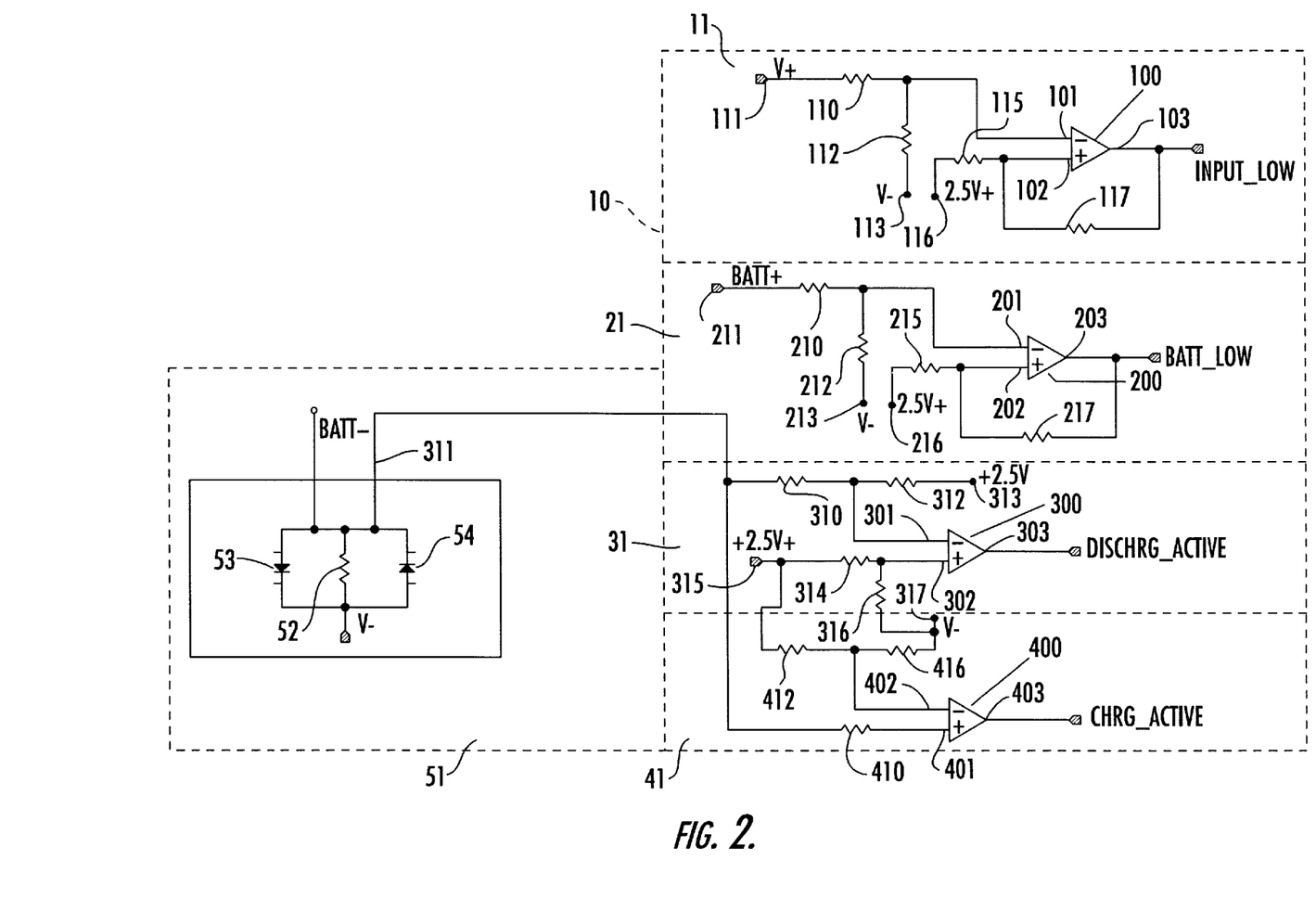
FIG. 2 shows the circuit configuration of the voltage and current monitoring stage of the battery test system of FIG. 1.

The voltage and current monitoring stage 10 is shown in detail in FIG. 2 as including a low input voltage detector section 11, that is comprised of a comparator 100 having a first (inverting (−)) input 101 coupled through a first resistor 110 to a first voltage (V+) input 111 and through a second resistor 112 to a second voltage (V−) input 113. Comparator 100 has a second (non-inverting (+)) input 102 coupled through a third resistor 115 to a third voltage input 116 (e.g., 2.5 V+ provided by a power supply 65), and a feedback resistor 117 coupled between an "INPUT_LOW" output 103 and input 102. The low input voltage detector section 11 serves to 10 monitor the output voltage from the equipment's normally employed power source, to determine during battery testing whether battery back-up is required. If the equipment currently requires the use of the back-up battery 55, the battery test is terminated and the battery is reconnected to the source.

As will be described, as long as the input voltage provided by the principal power supply 70 and monitored through the voltage divider formed by resistors 110 and 112 is greater than a prescribed threshold, the output "INPUT_LOW" is not asserted active, indicating that the equipment's normal power supply is functioning properly, so that a battery test may continue to completion. On the other hand, when the principal power supply's voltage is below the threshold, and the back-up battery is required, the comparator's output "INPUT_LOW" is asserted active, to terminate a battery test.

FIG. 2 further shows the voltage and current monitoring stage 10 to include a low battery voltage detector section 21, comprised of a comparator 200 having a first (inverting (−)) input 201 coupled through a resistor 210 to a battery voltage (BATT+) input 211, to which an isolated battery voltage (BATT+) for the back-up battery 55 is coupled, and through a resistor 212 to a voltage (V−) input 213. Comparator 200 has a second (non-inverting (+)) input 202 coupled through a resistor 215 to a third voltage (e.g., 2.5 V+) input 216, and a feedback resistor 217 coupled between a "BATT_LOW" output 203 and input 202. The low battery voltage detector section 21 serves to monitor the voltage available from the back-up battery 55 during a battery load test, to determine whether the back-up battery has failed.

During a battery load (performance) test, as long as the back-up battery voltage monitored through the voltage divider formed by resistors 210 and 212 is greater than a prescribed threshold, the output "BATT_LOW" will not be asserted active, indicating that the back-up battery 55 is potentially available as a viable back-up to the principal power supply 70. On the other hand, if the back-up battery voltage is below the threshold, the "BATT_LOW" output 203 of comparator 200 will be asserted active, indicating that the back-up battery has failed. The processor 40 responds to this active assertion of the "BATT_LOW" output 203 of comparator 200 by activating a set of alarm circuits within alarm stage 50. The alarm circuits consist of an audible buzzer, an LED indicator, and an electronic indication that is available to the external charging circuit.

The voltage and current monitoring stage 10 further includes a (battery) discharge current detector section 31 and a (battery) charge current detector section 41, each of which is coupled to monitor a current sense network 51, to which a second (BATT−) terminal of the back-up battery 55 is coupled. The current sense network 51 is comprised of a parallel circuit connection of a voltage dropping resistor 52 and Schottky diodes 53 and 54, coupled between a lead 311 to which the second battery voltage (BATT−) terminal of the back-up battery 55 is coupled, and voltage source terminal (V−). The Schottky diodes diodes 53 and 54 are connected with opposite polarities. These diodes limit the dissipation of the voltage-dropping resistor 52 due to charging or discharging currents.

The discharge current detector section 31 is comprised of a comparator 300 having a first (inverting (−)) input 301 coupled through a resistor 310 to lead 311 of the current sense network 51, and through a resistor 312 to a voltage (e.g., +2.5V) input 313. Comparator 300 has a second (non-inverting (+)) input 302 coupled through a resistor 314 to a (+2.5 V+) input 315, and a resistor 316 coupled to a voltage (V−) input 317. The battery discharge current detector section 31 monitors the voltage across the current sense network 51 to determine whether the back-up battery is operating in back-up mode.

If the voltage across the current sense network 51 exceeds a prescribed threshold, the DISCHARGE_ACTIVE output 303 of comparator 300 goes active, and it is inferred that current is being drawn by the equipment from the back-up battery 55 (as the back-up battery is being employed as a back-up power source), so that testing of the back-up battery cannot proceed. On the other hand, as long as the voltage across the current sense network 51 remains below the threshold, the DISCHARGE_ACTIVE output 303 of comparator 300 is not active, and it is inferred that the battery 55 is not being employed as a back-up power source, so that testing of the back-up battery may proceed.

The charge current detector section 41 comprises a comparator 400 having a first (non-inverting (+)) input 401 coupled through a resistor 410 to the lead 311 of the current sense network 51. Comparator 400 has a second (inverting (−)) input 402 coupled through a resistor 412 to the (+2.5V) voltage input 315, and a resistor 416 coupled to the voltage (V−) input 317. The battery charge current detector section 41 monitors the voltage across the current sense network 51 to determine whether the back-up battery is being charged. If the voltage across the current sense network 51 exceeds a prescribed threshold, the CHRG_ACTIVE output 403 of comparator 400 is active, and it is inferred that a substantial charging current is being supplied to the battery 55 from an external charging source. Once the battery becomes charged, the charging current will drop below the threshold, causing the CHRG_ACTIVE output 403 of comparator 400 to change to a non-active state. As will be described, provided that the battery is fully charged within a prescribed time window (e.g., twenty-four hours), this indicates to the control processor that it may proceed to conduct a back-up battery test.

Figure 3:
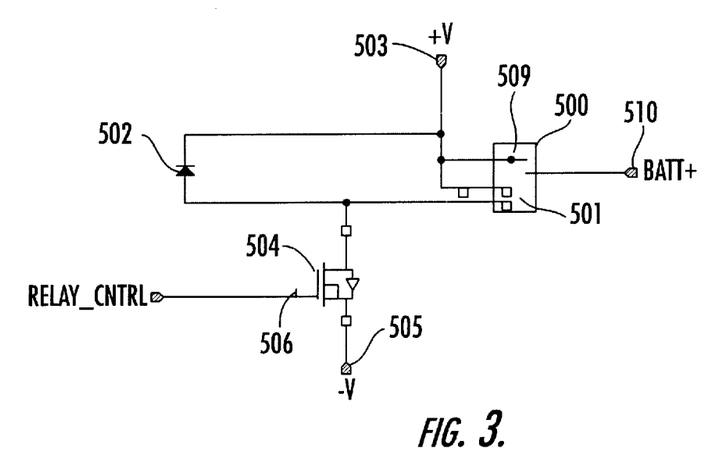
FIG. 3 shows the circuit configuration of the battery-isolating relay stage of the battery test system of FIG. 1.

The battery-isolating relay stage 20 is shown in FIG. 3 as comprising a relay 500 having a relay winding 501 coupled in circuit with a reverse voltage protection diode 502 between a (+V) voltage terminal 503 and a processor-controlled switch, such as field effect transistor (FET) 504, having its source-drain path coupled in circuit between the winding 500 and a (−V) voltage terminal 505. FET 504 has its control terminal (gate) 506 coupled to receive a relay control signal (RELAY_CNTRL) from the processor 40. The relay winding 500 is coupled with a controlled normally closed relay switch 509 between the (+V) voltage terminal 502 and an output terminal 510, from which the isolated battery voltage BATT+ is provided when the relay winding 501 is de-energized in the course of conducting a back-up battery test. The relay circuit 500 is closed for normal operation tying the source input voltage (_V) and back-up battery voltage BATT+together. When a back-up battery test is to be performed, the control processor 40 drives the RELAY_CNTRL signal to the gate 506 of FET 504 low, so as to open the relay and isolate the back-up battery from the principal power source 70.

Figure 4:
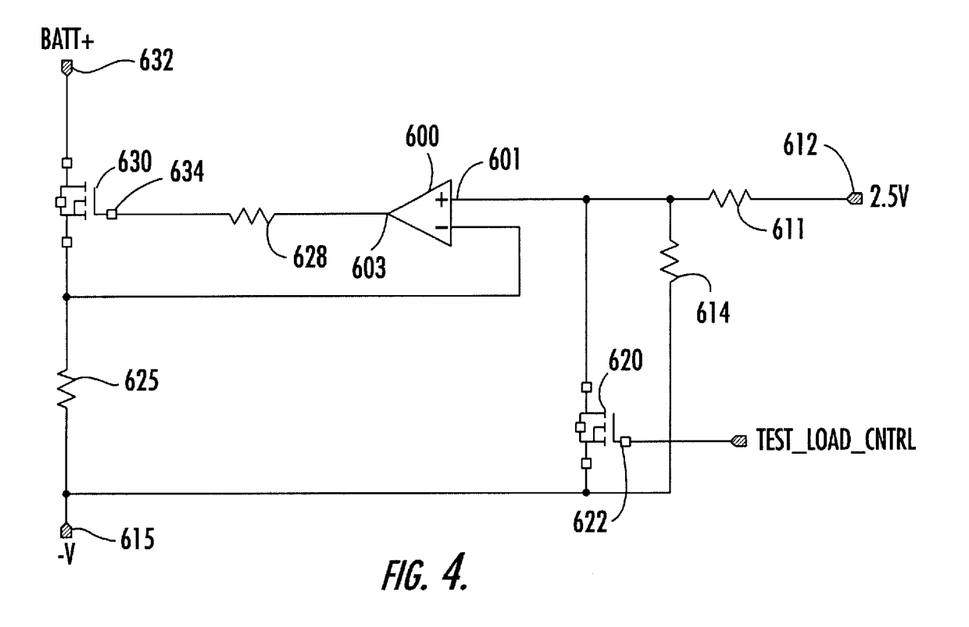
FIG. 4 shows the circuit configuration of the test load of the battery test system of FIG. 1.

The internal fixed current test load 30 is controllably operative to extract a fixed current from the back-up battery 55 during the test sequence. For this purpose, as shown in FIG. 4, the test load 30 comprises an operational amplifier (op-amp) 600 having a first (non-inverting (+)) input 601 coupled through a resistor 611 to a (2.5V) reference terminal 612 and through a resistor 614 to a (V−) reference terminal 615. Op-amp input 601 is further coupled through a processor-controlled switch, such as field effect transistor (FET) 620, having its source-drain path coupled in circuit between input 601 and the (−V) voltage terminal 615. FET 620 has its control terminal (gate) 622 coupled to receive a control signal (TEST_LOAD_CNTRL) from the processor 40. A second (inverting (−)) input 602 of the op-amp 600 is coupled through a sense resistor 625 to the (V−) reference terminal 615, and to the source of FET 630, which is coupled in circuit between a +BATT terminal 632 and the sense resistor 625. FET 630 has its control (gate) terminal 634 coupled through a resistor 628 to the output 603 of op-amp 600.

During a back-up battery load test, the processor 40 applies the active low signal (TEST_LOAD_CNTRL) to control gate 622 of the FET 620 for a prescribed time interval, whereby the output 603 of op-amp 600 increases, to turn FET 620 on, and thereby cause current to flow from the battery terminal BATT+through the sense resistor 625. Op-amp 600 senses the voltage across resistor 625 and adjusts its output 603 to maintain a fixed, constant test current.

As described above, during this load test, the control processor 40 will monitor the "INPUT_LOW" output 103 of comparator 100 of the input voltage detector section 11, to determine whether battery back-up is required during load testing. If the input voltage drops below a minimum allowed value, the "INPUT-LOW" will change state (e.g., go high), in response to which the control processor 40 will change the state of the signal (TEST_LOAD_CNTRL), thereby terminating the load test; also the relay 500 is closed by asserting the "RELAY-CNTRL" signal high (e.g., +5V). In this way the auxiliary battery 50 is still available for backing up the principal power source, even when a battery test is in progress.

Figure 5:
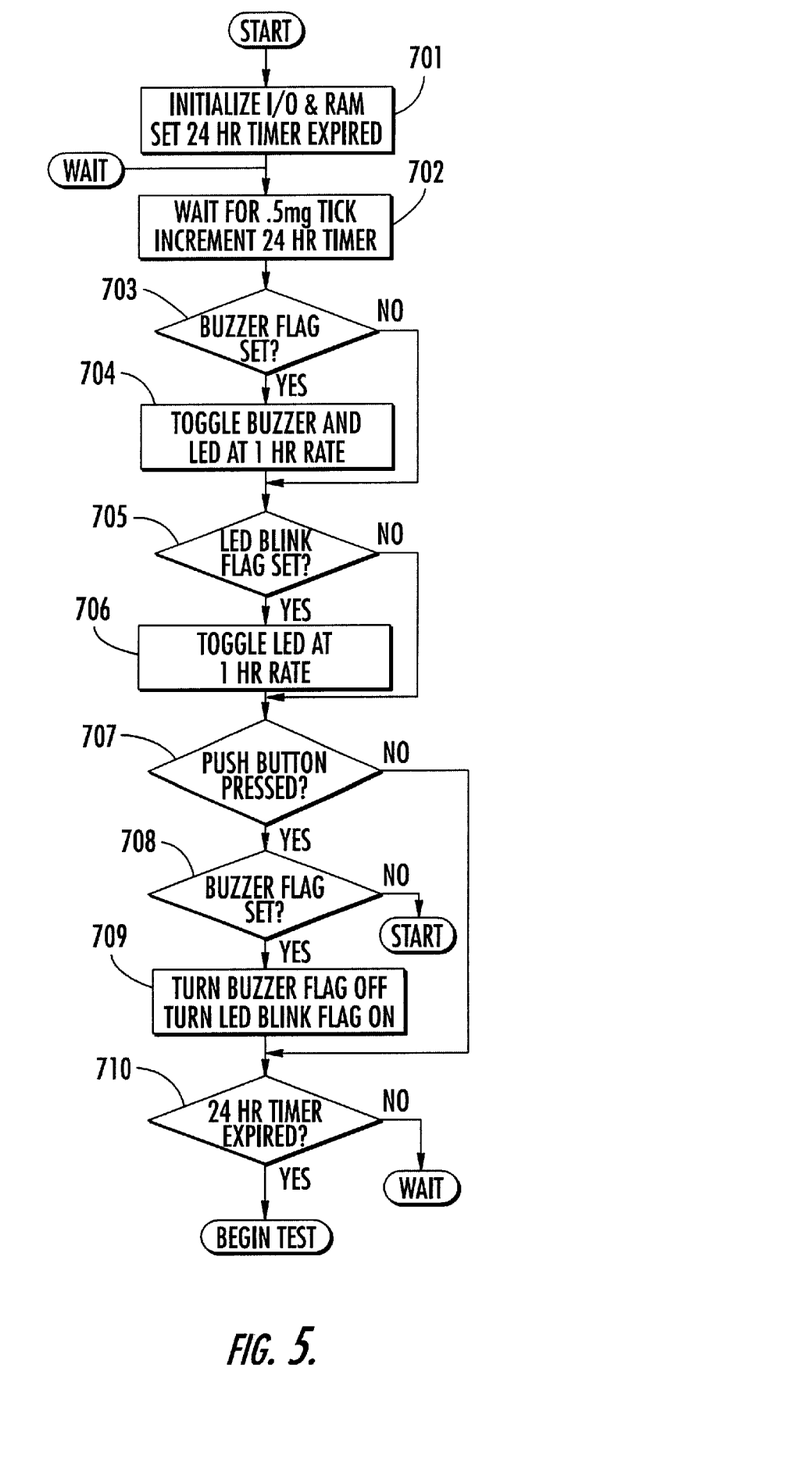
FIGS. 5 and 6 show successive steps of the test routine carried out by the battery test system of FIG. 1.
Figure 6:
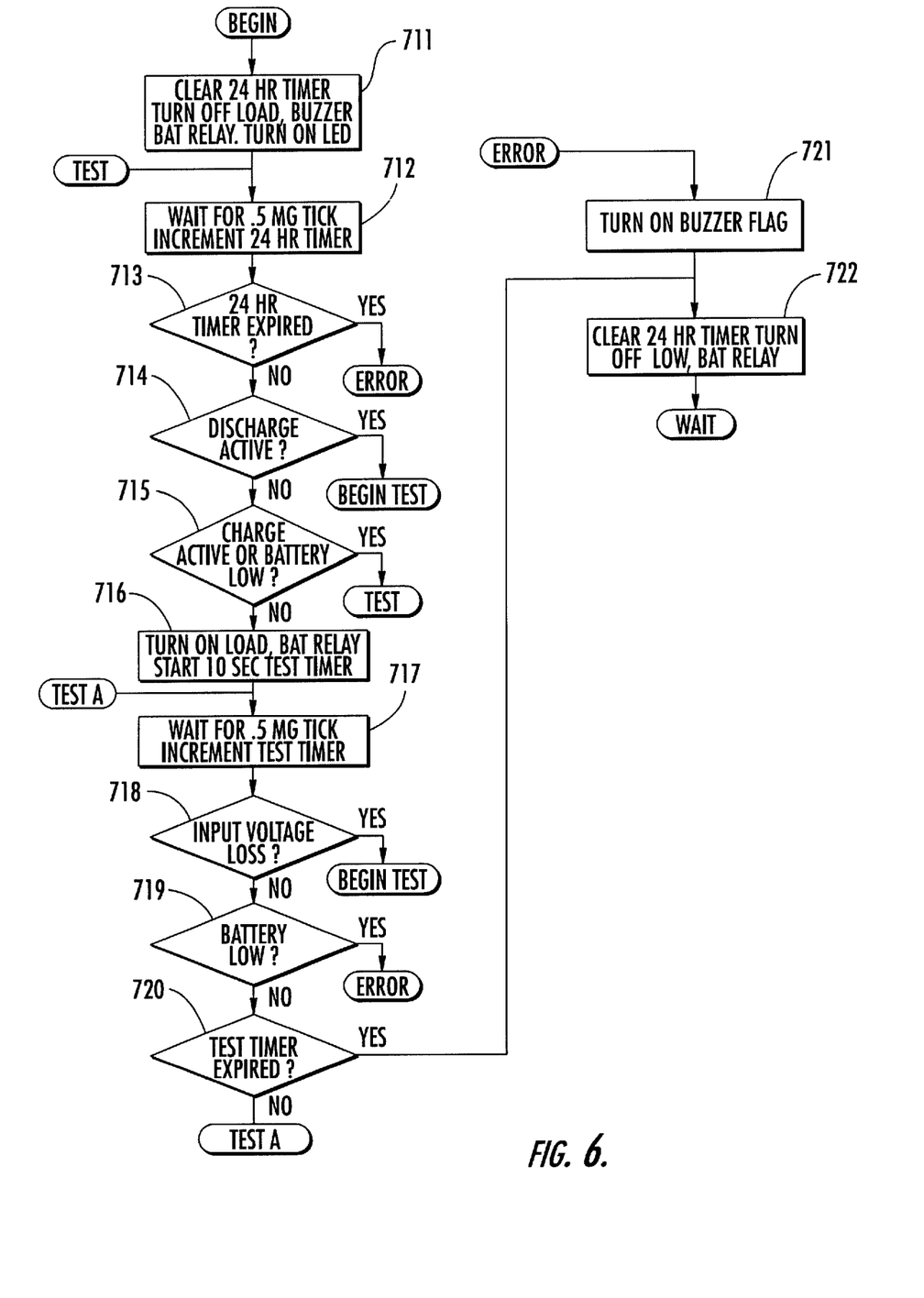

The operation of the automated battery test mechanism of the present invention may be readily understood with reference to the flow chart of FIGS. 5 and 6, which show successive steps of the battery test sequence carried out by the control processor 40 in the course of monitoring and controlling the operation of the above described battery interfacing and alarm stages of FIGS. 1–4.

At an initial step 701, the processor's associated input/output (I/O) ports and attendant memory (RAM) are initialized, and a reference periodic soft-timer or counter is set as 'expired' or timed out. For purposes of providing a non-limiting example, the soft-timer may have a time-out interval of twenty-four hours, associated with the period rate at which the battery test sequence is executed. This soft-timer—counter is repetitively incremented at some prescribed clock rate, such as every 0.5 milliseconds.

Next, at step 702, the initialization routine waits for a first (0.5 ms) incrementing of the soft-timer and then, in query step 703, checks whether an audible alarm flag associated with an audible alarm (e.g., buzzer) in the alarm stage 50 has been set. As pointed out briefly above, and as will be described, the alarm components within alarm stage 50 are controllably activated by the control processor 40 in response to the active assertion of the "BATT_LOW" by the comparator 200 of the low battery voltage detector section 21 within the voltage and current monitoring stage 10. Thus, if the answer to query step 703 is YES, the routine transitions to step 704, wherein the audible buzzer is toggled and the visual LED alarm indicator is illuminated at a prescribed flashing rate (e.g., 1 Hz), and the routine transitions to query step 705. If the answer to query step 703 is NO, the routine also transitions to query step 705.

In query step 705, the routine checks whether an LED blinking flag associated with a visual alarm in the alarm stage has been set. If the answer to query step 705 is YES, the routine transitions to step 706, wherein the visual indicator is toggled at a prescribed flashing rate (e.g., 1 Hz), and the routine then transitions to query step 707. If the answer to query step 705 is NO, the routine also transitions to query step 707.

In query step 707, the routine checks whether a push button switch input 45 to the control processor 40 has been depressed. As pointed out above, the control processor 40 also receives user input from a push button switch 45 that is active when the push button is depressed. In particular, the control program causes the control processor to respond in two ways to the operation of the push button switch 45, depending on other operational conditions.

If the audible alarm portion of the alarm stage 50 is active (as indicated by "AUDIBLE_ALARM_CNTRL" output being asserted active (e.g., at +5V) then pressing push button switch 45 for one second will clear the audible alarm but leave the LED and electronic alarms active. The alarms will remain in that state until the next back-up battery test sequence is initiated. If the audible alarm is inactive when the push button switch 45 is pressed continuously for a prescribed period of time (e.g., one second), then a test sequence is initiated.

Namely, as shown in the flow routine of FIG. 5, if the answer to query step 707 is YES, the routine transitions to query step 708 to determine if the audible alarm (buzzer) flag has been set. If the answer to query step 708 is NO, the routine loops back to START. However, if the answer to query step 708 is YES, the routine transitions to step 709, wherein the audible (buzzer) flag is turned off, the LED flag is turned on, and the routine transitions to query step 710. If the answer to query step 707 is NO, the routine also transitions to query step 710. In query step 710, the periodic (24 hour) timer is checked to see whether it has expired. If the answer to query step 710 is NO, the routine loops back to step 502, wherein the timer is incremented. If the answer to query step 710 is YES, however, the routine begins the battery test by transitioning to step 711, wherein a set of test precursor conditions are set.

In particular, in step 711, the periodic soft-timer is cleared or reset. In addition, the TEST_LOAD_CNTRL input to the internal fixed current test load 30 set inactive. Also, the RELAY_CNTRL output from the processor 40 to the battery-isolating relay stage 20 is set inactive. Inputs to the alarm stage 50 disable the alarms.

Next, at step 712, the routine waits for an incrementing of the soft-timer and then, in query step 713, checks whether the periodic timer has expired. If the answer to query step 713 is YES, indicating an error condition, the routine transitions to step 721, which turns on the audible alarm flag. If the answer to query step 713 is NO, the routine transitions to query step 714, which checks the state of the DISCHARGE_ACTIVE output of the current sense network 51. As pointed out above, the active state of the DISCHARGE_ACTIVE output implies that current is being drawn by the equipment from the back-up battery 55 (as the back-up battery is being employed as a back-up power source), so that testing of the back-up battery should not proceed, and the routine loops back to step 711. On the other hand, as long as the voltage across the current sense network 51 remains below the threshold, the DISCHARGE_ACTIVE output is not active, and it is inferred that the battery 55 is not being employed as a back-up power source, so that testing of the back-up battery may proceed. In this case, the answer to query step 714 is NO, and the routine transitions to query step 715.

In query step 715, the CHRG_ACTIVE output of the current detector section 41 is examined. If the answer to query step 715 is YES, indicating that charging current is being supplied to the battery 55 from an external charging source, the battery test is deferred until the battery is charged. In this case, the routine loops back to step 712. On the other hand, if the answer to query step 715 is NO, indicating that the back-up battery is charged, the routine transitions to step 716.

In step 716, the processor asserts the RELAY_CNTRL input to the battery-isolating relay stage 20 and the TEST_LOAD_CNTRL to the internal fixed current test load 30 active for a prescribed period of time (e.g., ten seconds), so as to test the battery. Next, in step 717, the routine again waits for an incrementing of the soft-timer and then, in query step 718, checks the INPUT_LOW output lead of the low input voltage detector section 11. As noted above, as long as the input voltage provided by the principal power source is greater than a prescribed threshold, the output "INPUT_LOW" is not asserted active, indicating that the equipment's normal power supply is functioning properly, so that the battery test may continue, in which case the answer to query step 718 is NO. In this case, the routine transitions to query step 719. However, if the principal power supply's voltage is below the threshold, and the back-up battery is required, the comparator's output "INPUT_LOW" is asserted active and the answer to query step 718 is YES. In this case, the routine loops back to step 711.

In query step 719, the BATT_LOW output of the low battery voltage detector section 21 is examined. As pointed out above, if the back-up battery voltage is below threshold, the "BATT_LOW" output will be asserted active, indicating that the back-up battery has failed (ERROR), and the routine transitions to the alarm condition assertion step 721. On the other hand, if "BATT_LOW" is not be asserted active, indicating that the back-up battery 55 is available as a back-up to the principal power supply, the routine transitions to query step 720 to determine whether the periodic timer has expired.

If the answer to query step 720 is NO (the timer has not expired), the routine loops back to step 717 to increment the timer and proceed through steps 718–719 as described above. In this manner, the health of the battery is continuously monitored during the prescribed load test, and an alarm condition immediately set if the battery fails. If the answer to query step 720 is YES (the timer has expired), the routine transitions to step 722. In step 722, the periodic time is cleared, and the TEST_LOAD_CNTRL input to the internal fixed current test load 30 is turned off. Also, the RELAY_CNTRL output from the processor 40 to the battery-isolating relay stage 20 is set inactive. The routine then loops back to step 502 of the initialization sequence.

As will be appreciated from the foregoing description, the potential problem of a failed back-up battery for a system that requires continuous electrical power is effectively obviated by the processor-controlled mechanism of the present invention, which periodically tests the performance of the back-up battery, and provides an alarm indication should the back-up battery be determined to be in a failed condition. Advantageously, the invention is configured to isolate and test the battery without compromising the availability of the battery as an immediate back-up should the principal power system require it.

While we have shown and described an embodiment in accordance with the present invention, it is to be understood that the same is not limited thereto but is susceptible to numerous changes and modifications as known to a person skilled in the art. As a result, we do not wish to be limited to the details shown and described herein, but intend to cover all such changes and modifications as are obvious to one of ordinary skill in the art.

What is claimed:

1. A method of determining the performance capability of an auxiliary battery, that is employed as a back-up power source for an electrically powered system in the event of a deficiency in the ability of a primary power source to provide electrical power to said system, said method comprising the steps of:
   (a) periodically testing at least one electrical characteristic of said auxiliary battery without compromising the availability of said auxiliary battery as said back-up power source; and
   (b) generating at least one alarm indication in response to step (a) determining said auxiliary battery to be in a failed condition.

2. A method according to claim 1, wherein step (b) comprises generating at least two of audible, visible, and electronic alarm indications, in response to step (a) determining said auxiliary battery to be in a failed condition.

3. A method according to claim 1, wherein step (a) comprises periodically isolating said auxiliary battery from an electrical circuit with said primary power source, and performing a prescribed load test upon said auxiliary battery as isolated from said primary power source.

4. A method according to claim 3, wherein step (a) comprises drawing a prescribed load current from said auxiliary battery and monitoring a voltage associated with said load current for the presence of an excessive battery voltage drop and, in response to detecting an excessive voltage drop, determining that said auxiliary battery has failed.

5. A method according to claim 3, wherein step (a) further comprises monitoring charging current to said auxiliary battery for an interval of time and, in response to the level of battery charging current differing from a prescribed threshold at the end of said interval of time, determining that said auxiliary battery has failed, but otherwise isolating said auxiliary battery from said primary power source and drawing a prescribed load current from said auxiliary battery, and monitoring a voltage associated with said load current for the presence of an excessive battery voltage drop and, in response to detecting an excessive voltage drop, determining that said auxiliary battery has failed.

6. A method according to claim 3, wherein step (a) further includes monitoring an output voltage of said primary power source and, in response to said output voltage of said primary power source departing from a prescribed level, terminating said testing of said at least one electrical characteristic of said auxiliary battery, and terminating isolation of said auxiliary battery from said electrical circuit with said primary power source, so that said auxiliary battery may be employed as back-up to said primary power source.

7. A method according to claim 1, wherein step (a) includes a precursor step of monitoring said auxiliary battery for the presence of discharge current and, in response to detecting discharge current, deferring testing of said auxiliary battery.

8. A system for determining the performance capability of an auxiliary battery, that is employed as a back-up power source for an electrically powered system in the event of a deficiency in the ability of a primary power source to provide electrical power to said system, said system comprising:

a processor-controlled circuit arrangement that is operative to periodically controllably isolate said auxiliary battery from said primary power source and test at least one electrical characteristic of said auxiliary battery, without preventing said auxiliary battery from being connected in circuit with said primary power source in the event of a need for a back-up power source for said electrically powered system; and an alarm arrangement that is operative to generate at least one alarm indication in response to said processor-controlled circuit arrangement determining said auxiliary battery to be in a failed condition.

9. A system according to claim 8, wherein said alarm arrangement includes at least two of audible, visible, and electronic alarms.

10. A system according to claim 8, wherein said processor-controlled circuit arrangement includes a discharge current detector that is operative to monitor said auxiliary battery for the presence of discharge current and, in response to detecting discharge current, deferring testing of said auxiliary battery.

11. A system according to claim 8, wherein said processor-controlled circuit arrangement includes a processor-controlled relay coupled in circuit with said primary power source and said auxiliary battery, and being configured to controllably isolate said auxiliary battery from said primary power source, and a controlled load circuit that is controllably coupled in circuit with said auxiliary battery as isolated by said processor-controlled relay from said primary power source, and wherein said processor-controlled circuit arrangement is operative to cause said controlled load circuit to draw a prescribed load current from said auxiliary battery, and further including a voltage monitoring circuit that is operative to monitor a voltage associated with said load current for the presence of an excessive battery voltage drop, and wherein said alarm arrangement is operative to generate said at least one alarm in response to said processor-controlled circuit arrangement detecting an excessive battery voltage drop, indicating that said auxiliary battery has failed.

12. A system according to claim 11, wherein said processor-controlled circuit arrangement includes a charging current detector that is operative to monitor charging current to said auxiliary battery for an interval of time and, in response to the level of battery charging current differing from a prescribed threshold at the end of said interval of time, determining that said auxiliary battery has failed, but otherwise isolating said auxiliary battery from said primary power source and drawing a prescribed load current from said auxiliary battery, and monitoring a voltage associated with said load current for the presence of said excessive battery voltage drop and, in response to detecting an excessive voltage drop, determining that said auxiliary battery has failed.

13. A system according to claim 11, wherein said processor-controlled circuit arrangement includes a low input voltage detector that is operative to monitor an output voltage of said primary power source and, in response to said output voltage of said primary power source departing from a prescribed level, terminating said testing of said at least one electrical characteristic of said auxiliary battery, and terminating isolation of said auxiliary battery from said electrical circuit with said primary power source, so that said auxiliary battery may be employed as back-up to said primary power source.

14. A processor-controlled arrangement for periodically testing the performance capability of an auxiliary battery, that is employed as a back-up power source for an electrically powered system in the event of a deficiency in the ability of a primary power source to provide electrical power to said system, said arrangement comprising:

an auxiliary battery current discharge detector that is operative to monitor said auxiliary battery for the presence of discharge current and, in response to detecting discharge current, deferring testing of said auxiliary battery, but otherwise permitting testing of said auxiliary battery;

a processor-controlled relay coupled in circuit with said primary power source and said auxiliary battery, and being configured to controllably isolate said auxiliary battery from said primary power source, and a controlled load circuit that is controllably coupled in circuit with said auxiliary battery as isolated by said processor-controlled relay from said primary power source, and wherein said processor-controlled circuit arrangement is operative to cause said controlled load circuit to draw a prescribed load current from said auxiliary battery, and further including a voltage monitoring circuit that is operative to monitor a voltage associated with said load current for the presence of an excessive battery voltage drop; and an alarm arrangement that is operative to generate said at least one alarm in response to said processor-controlled circuit arrangement detecting an excessive battery voltage drop, indicating that said auxiliary battery has failed.

15. A processor-controlled arrangement according to claim 14, further including a low input voltage detector that is operative to monitor an output voltage of said primary power source and, in response to said output voltage of said primary power source departing from a prescribed level, terminating said testing of said at least one electrical characteristic of said auxiliary battery, and terminating isolation of said auxiliary battery from said electrical circuit with said primary power source, so that said auxiliary battery may be employed as back-up to said primary power source.

16. A processor-controlled arrangement according to claim 15, further including a charging current detector that is operative to monitor charging current to said auxiliary battery for an interval of time and, in response to the level of battery charging current differing from a prescribed threshold at the end of said interval of time, determining that said auxiliary battery has failed, but otherwise permitting testing of said auxiliary battery.

* * * * *